(12) United States Patent
Kubara et al.

(10) Patent No.: US 6,646,330 B2
(45) Date of Patent: Nov. 11, 2003

(54) LEAD FRAME FOR SEMICONDUCTOR DEVICE, PROCESS FOR PRODUCING THE SAME AND SEMICONDUCTOR DEVICE USING THE SAME

(75) Inventors: Takashi Kubara, Chikushino (JP); Hisahiro Tanaka, Fukuoka (JP); Matsuo Masuda, Usa-gun (JP); Tsuyoshi Tokiwa, Nakatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/953,915

(22) Filed: Sep. 18, 2001

(65) Prior Publication Data

US 2002/0053721 A1 May 9, 2002

(30) Foreign Application Priority Data

Sep. 21, 2000 (JP) .......................................... 2000-286725

(51) Int. Cl.[7] .......................... H01L 23/495; H01L 21/44; H01L 21/48
(52) U.S. Cl. ..................... 257/677; 257/666; 257/676; 257/734; 257/736; 257/690; 438/123; 438/106; 438/124
(58) Field of Search ................................ 257/666, 677, 257/690, 750, 734, 736, 676; 361/813; 438/123, 106, 124

(56) References Cited

U.S. PATENT DOCUMENTS

| | | | | |
|---|---|---|---|---|
| 4,482,780 A | * | 11/1984 | Mitchell ..................... 136/258 |
| 4,707,724 A | * | 11/1987 | Suzuki et al. ................. 357/71 |
| 5,329,158 A | * | 7/1994 | Lin ............................. 257/772 |
| 5,684,329 A | * | 11/1997 | Serizawa ..................... 257/677 |
| 5,821,627 A | * | 10/1998 | Mori et al. .................. 257/780 |
| 6,034,422 A | * | 3/2000 | Horita et al. ................ 257/677 |
| 6,087,712 A | * | 7/2000 | Kim et al. .................... 257/666 |
| 6,087,714 A | * | 7/2000 | Kubara et al. .............. 257/666 |
| 6,395,583 B1 | | 5/2002 | Kubara et al. |

FOREIGN PATENT DOCUMENTS

JP        2000307046        11/2000

* cited by examiner

*Primary Examiner*—Steven Loke
*Assistant Examiner*—Nitin Parekh
(74) *Attorney, Agent, or Firm*—Stevens, Davis, Miller & Mosher, LLP

(57) ABSTRACT

The present invention relates to a lead frame for semiconductor devices having an outer lead part improved in solder wettability which comprises i. a substrate comprising an alloy comprising at least one member selected from the group consisting of nickel, copper, iron and (nickel and copper and iron), ii. an inner lead part having a surface treated layer A, the surface treated layer A comprising silver or an alloy comprising silver, and iii. an outer lead part having a surface treated layer B, the surface treated layer B comprising silver and tin, or copper and tin, wherein the surface treated layer B has on its surface an oxidized layer comprising tin and oxygen, the atomic ratio of oxygen to tin in the oxidized layer is 0.5–1.8 and the thickness of the layer is not more than 20 nm.

8 Claims, 4 Drawing Sheets

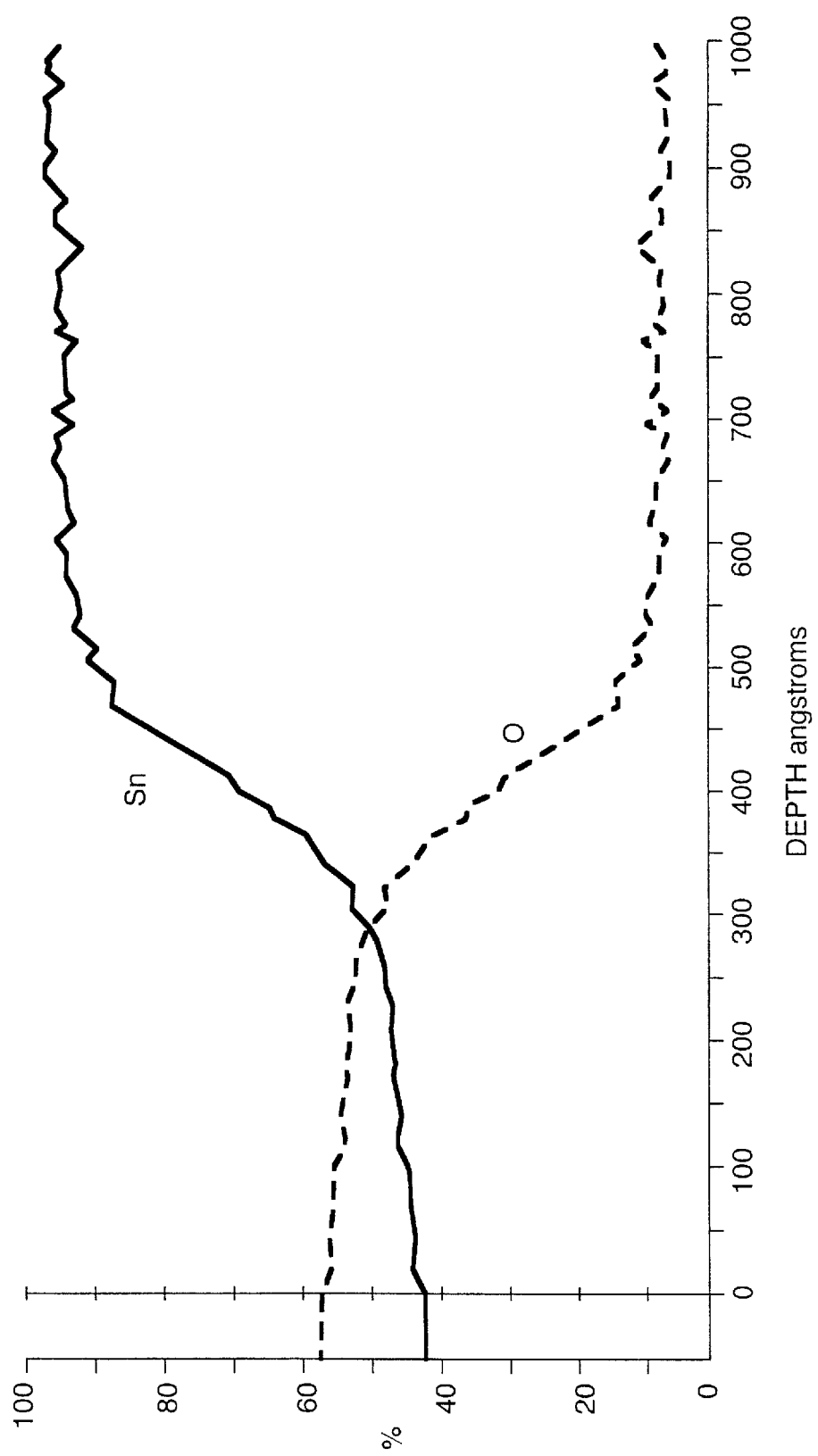

LEAD FRAME FOR SEMICONDUCTOR DEVICE, PROCESS FOR PRODUCING THE SAME AND SEMICONDUCTOR DEVICE USING THE SAME

BACKGROUND OF THE INVENTION

1. Field of the Invention

The present invention relates to a lead frame for semiconductor devices which does not contain lead, one of the environmentally harmful substances, to a process for producing the same and to a semiconductor device formed by using the above-mentioned lead frame.

2. Description of the Related Art

Among the materials used in lead frames for semiconductor devices, lead used in solder is known to be a substance particularly harmful to environment. When allowed to stand, lead dissolves out of solder and exerts adverse effects on human and other organisms. Accordingly, development of solder, soldering paste and the like which do not use lead has been forwarded in the electronic industry.

A lead frame plated with palladium on the whole surface as a substitute for lead-containing solder has been put to practical use. However, when palladium used as a simple element is subjected to heat at the die bonding process and the wire bonding step, the wetability of solder tends to deteriorate, causing a problem in the reliability of soldering at the time of surface mounting. In recent years, therefore, a lead frame has been proposed wherein a thin plating of gold has been applied to the surface of palladium as a protective film. However, when flash plating of gold is applied to the outermost surface of palladium, the adhesion of mold resin with the lead frame tends to be poor, so that it is necessary to use a mold resin which is improved in adhesion with gold but is of high cost. Moreover, palladium is limited as to countries that can supply it and frequently the short of supply thereof results in increase in price, leading to increase in cost. When gold is used as a protective film, the cost increases further.

A lead frame for semiconductor devices plated on the whole surface with palladium is apt to develop a flash in the step of sealing an IC with mold resin when assembling the IC, and hence an additional step of removing the flash is required. This leads to increase in cost. In a lead frame plated on the whole surface with palladium, further, a large potential difference develops between palladium and a metal of the lead frame substrate, so that it is necessary to interpose nickel or palladium-nickel alloy between palladium and the substrate. At this time, corrosion will occur when nickel or nickel alloy, or iron or iron alloy, is used for the substrate; at the present state, therefore, the above-mentioned method can be applied only to lead frames using copper or copper alloy for the substrate.

As to a solder or a soldering paste which do not use lead and use materials other than palladium, it has been proposed to form a surface layer with a solder or a soldering paste incorporated with such metals as indium, bismuth and zinc in place of lead used in tin-lead solders.

With regard to solder and soldering paste used for reflow soldering, alloys of three-component or four-component system have been proposed which contain, in addition to tin, at least two kinds of metals. As to solder for plating, since it is difficult to control the deposition composition of three-component or four-component alloys in the plating liquor at the time of electroplating, alloys of two-component system comprising tin and other one kind of metal are mostly used. However, alloys comprising tin and additionally indium are hardly used in practice because of high cost of indium. Alloys comprising tin and additionally bismuth can have a low melting point but they are apt to become hard and brittle and hence are poor in processability, so that they can be hardly used for lead frames which require bending in processing. Furthermore, they are poor in solder wettability and hence show a low bond strength and a low heat fatigue strength; moreover, since bismuth tends to deposit at the interface, the so-called lift-off phenomenon, wherein the IC lifts from the solder, is apt to develop at the time of surface mounting. Alloys comprising tin and additionally zinc have melting points near to those of tin-lead solders and moreover zinc is inexpensive; however, since zinc is readily oxidized in the air, when the alloys are subjected to thermal hysteresis in the step of assembling the IC, they tend to be oxidized to cause deterioration of solder wettability.

In recent years, therefore, as to a solder or a soldering paste which do not use lead, alloys comprising tin and additionally silver have been proposed.

More specifically, with regard to a lead frame for semiconductor devices plated with an alloy comprising tin and additionally silver, JP-A-10-102283 discloses "an electric-electronic circuit element having a glossy tin-solver alloy plating film having a content of silver in the film of 0.1%–10% and a film thickness of 0.1–100 μm from a non-cyanide tin-silver alloy electroplating bath".

JP-A-2000-164782 discloses "a semiconductor device having a lead frame formed essentially of nickel or nickel alloy, copper or copper alloy, or iron or iron alloy, wherein the inner lead part is provided with a surface layer of silver or an alloy containing silver and the outer lead part is provided with a surface layer of an alloy at least containing silver and tin of the body-centered tetragonal structure preferentially oriented in the (101) plane and/or the (211) plane".

SUMMARY OF THE INVENTION

The present inventors have made extensive study to provide a lead frame for semiconductor devices which does not contain lead, one of the environmentally harmful substances, exhibits a good solder wettability and a high bond strength and is of a low cost, and resultantly have attained the present invention.

The present invention relates to a lead frame for semiconductor devices which comprises i. a substrate comprising nickel, copper, iron or an alloy comprising at least one member selected from the group consisting of nickel, copper and iron, ii. an inner lead part having a surface layer A, the surface layer A comprising silver or an alloy comprising silver, and iii. an outer lead part having a surface layer B, the surface layer B comprising silver and tin, or copper and tin, wherein the surface layer B has on its surface an oxidized layer comprising tin and oxygen, the atomic ratio of oxygen to tin in the oxidized layer is 0.5–1.8 and the thickness of the oxidized layer is not more than 20 nm.

The present invention is not bound to any theory. However, it is considered that decreasing the proportion of oxygen by selecting the atomic ratio of oxygen to tin in the range of 0.5–1.8 helps to prevent the formation of stable $SnO_2$ having a high melting point in the oxidized layer and helps to prevent the deterioration of solder wettability. It is further considered that when the thickness of the oxidized layer is selected at not more than 20 nm, the oxidized layer assumes to have an island structure or a structure near to an island structure. Accordingly, the tin of the surface layer B assumes to have a state exposed or nearly exposed to the surface; resultantly diffusion from molten solder and melting at the eutectic temperature are facilitated, leading to further improvement of solder wettability.

The above-mentioned oxidized layer can be formed by swelling a coarse and thick oxidized layer formed on the surface layer B as the result of oxidation with a treating agent preferably containing sodium hydroxide or sodium triphosphate and subjecting the swollen layer to an etching treatment by an electrochemical method.

The silver content of the surface layer B is preferably 1–8% by weight and the copper content is preferably 0.1–2% by weight. The thickness of the layer is preferably 3–15 µm. Such a surface layer B before swelling and etching can be formed by electroplating using as the anode an insoluble electrode containing at least one member selected from the group consisting of platinum, iridium, tantalum, rhodium, ruthenium, and the oxides thereof. For preventing the development of electromigration of silver at the time of IC drive, the tin has preferably the body-centered tetragonal structure.

The process for producing a lead frame for semiconductor devices according to the present invention comprises, for the purpose of forming an oxidized layer comprising tin and oxygen in which the atomic ratio of oxygen to tin is 0.5–1.8 and of which the thickness is not more than 20 nm on the surface of a surface layer B provided to the surface of the outer lead part, a step of swelling the outer lead part having the surface layer B with a treating agent containing sodium hydroxide or sodium triphosphate and a step of subjecting the swollen part to an etching treatment by an electrochemical method.

The present invention further relates to a semiconductor device formed by using the above-mentioned lead frame for semiconductor devices.

According to the present invention, there can be provided a lead frame for semiconductor devices which does not contain lead, one of the environmentally harmful contaminants, exhibits a good solder wettability and high bond strength and is of a low cost, a process for producing the same and a semiconductor device using the lead frame for semiconductor devices.

BRIEF DESCRIPTION OF THE DRAWINGS

FIG. 5 is a graph showing a relation between the composition of the oxidized layer and the depth thereof in Comparative Example 1.

DESCRIPTION OF THE PREFERRED EMBODIMENTS

Some preferred embodiments of the present invention are described below.

Embodiment 1

Figure 1:
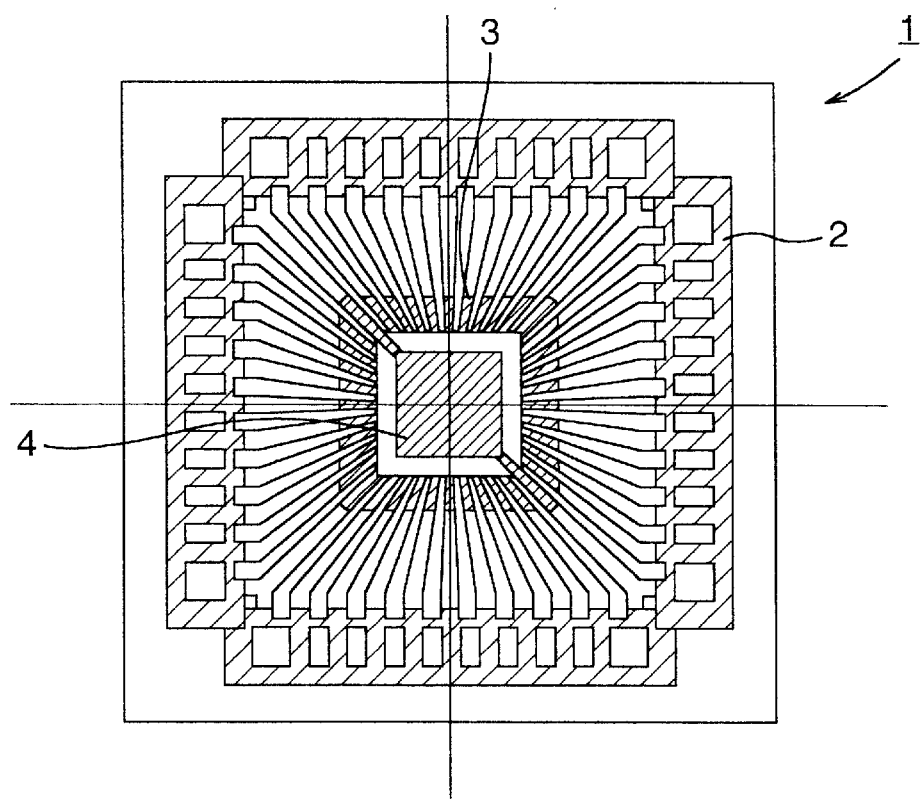
FIG. 1 is a plan view showing the lead frame for semiconductor devices in Embodiment 1 of the present invention.
Figure 2:
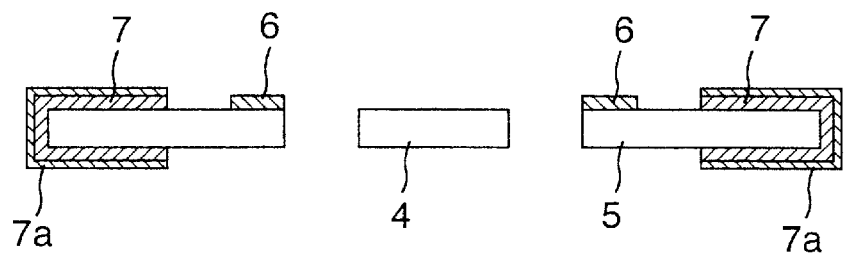
FIG. 2 is a schematic sectional view showing the lead frame for semiconductor devices in Embodiment 1 of the present invention.

FIG. 1 is a plan view showing a lead frame in Embodiment 1 of the present invention, and FIG. 2 is a schematic sectional view showing a lead frame in Embodiment 1 of the present invention.

In FIGS. 1 and 2, numeral 1 indicates the lead frame for semiconductor devices in Embodiment 1, 2 an outer lead part, 3 an inner lead part, 4 a pad on which an integrated circuit is placed, 5 a lead frame substrate, 6 an Ag layer, which is a surface layer of silver provided to the surface of the inner lead part 3, 7 is an Sn—Ag layer which is a surface layer comprising silver and tin provided to the surface of the outer lead part 2, and 7a is an oxidized layer formed on the surface of the Sn—Ag layer 7.

The lead frame substrate 5 is formed by working up a sheet of alloy 194 (Cu alloy comprising 2.3% of Fe, 0.12–0.15% of Zn and 0.02–0.03% of P) into the form of a lead frame through a pressing step and then, after a washing step, as occasion demands, subjecting the frame thus formed to a heat treatment step to correct the deformation which has developed when the frame was punched out with a press in the pressing step. According to the present invention, the problem of corrosion does not occur unlike in a case where palladium plating is applied, so that nickel, copper, iron or an alloy comprising at least one member selected from the group consisting of nickel, copper and iron can be used for the substrate. The alloy sheet can be worked up into the form of lead frame also through an etching step besides through a pressing step.

The process for producing a lead frame for semiconductor devices according to the present invention is described in detail below.

First, oily substances which have adhered to the lead frame substrate 5 in the pressing step and heat treatment step are removed, if necessary and desired, by a dipping method using an alkaline degreasing agent and the like or an electric method, used each alone or in combination, and then, if necessary and desired, an underlayer plating is formed in a thickness of 0.2 µm–0.5 µm. The kind of underlayer plating is not particularly restricted. In the present Example, an underlayer plating of copper was formed. The plating was conducted by using a copper cyanide bath at a bath temperature of 40° C. and a current density of 15 A/dm$^2$. The film thickness of the plating was 0.2 µm.

Thereafter, through a silver plating step, an Ag layer 6 or an alloy layer 6 comprising silver is formed in a thickness of preferably 3 µm–8 µm on the inner lead part 3. In the present Example, the silver plating was conducted by using a silver cyanide bath at a bath temperature of 40° C. and a current density of 30 A/dm$^2$. The film thickness was 5 µm.

In order to improve the adhesion between the outer lead part 2 and an Sn—Ag layer 7 comprising silver and tin or an Sn—Cu layer 7 comprising copper and tin each formed on the surface thereof, the surface of the outer lead part 2 is subjected preferably to an etching treatment using a treating agent comprising at least one member selected from the group consisting of hydrochloric acid, nitric acid and sulfuric acid. In the present Example, the surface was treated with a treating agent containing 10 g/L of hydrochloric acid at 30° C. for 15 seconds to remove impurities adhering to the surface and simultaneously to etch the surface. By this treatment, the adhesion between the outer lead part 2 and the Sn—Ag layer 7 or the Sn—Cu layer 7 is improved through an anchoring effect.

After the above-mentioned treatment, an Sn—Ag layer 7 or an Sn—Cu layer 7 is formed on the outer lead part 2 by electroplating. The film thickness of the layer is preferably 3 μm–15 μm, the content of silver is preferably 1–8% by weight and the content of copper is preferably 0.1–2% by weight. The composition of the plating liquor is, preferably, 50–200 g/L of acid, 20–60 g/L of tin metal, 0.5–3 g/L of silver metal and 0.1–20 g/L of copper metal. The ratio of $Sn^{2+}$ ions to $Ag^+$ ions and the ratio of $Sn^{2+}$ ions to $Cu^+$ ions are changeable based on the desired alloy film. For example, in order to obtain the alloy film consisting of 99.3% of Sn and 0.7% of Cu, the ratio of $Sn^{2+}$ ions to $Cu^+$ ions would be 50:1–100:1. The acid may be selected as desired, for example, from alkanesulfonic acids, alkanolsulfonic acids and sulfamic acids. The tin salt may be selected as desired, for example, from tin methanesulfonate and SnO. The silver salt may be selected as desired, for example, from silver methanesulfonate and $Ag_2O$. The copper salt may be selected as desired, for example, from copper methanesulfonate, copper oxide and copper sulfate. In the present Example, 150 g/L of methanesulfonic acid was used as the acid, SnO was used in a concentration of 40 g/L in terms of metallic tin and $Ag_2O$ was used in a concentration of 1.5 g/L in terms of metallic silver.

With regard to additives, at least, as a stabilizer for silver, at least one member selected from the group consisting of sulfur compounds, thioamide compounds, thiol compounds and thiosulfates may be added. As a stabilizer for tin, at least one member selected from the group consisting of carboxylic acids, sulfamic acids, pyrophosphates and chelating agents may be added. As a stabilizer for copper, at least one member selected from the group consisting of the same member of the stabilizer for silver may be added. As a crystallization controlling agent, there may be added at least one member selected from the group consisting of aromatic sulfonates, aliphatic sulfonates, hydantoin compounds, cysteine compounds, aromatic organic amines, aliphatic aldehydes, aromatic aldehydes, nonionic surfactants, amphoteric surfactants and anionic surfactants. In the present Example, 3 g/L of 2-aminobenzenethiol as a stabilizer for silver, 5 g/L of naphthalensulfonic acid monopolyethylene glycol ether as a stabilizer for tin, and 80 g/L of bisphenol-A di-polyethylene glycol ether as a crystallization controlling agent were added. The amounts of additives to be added can be appropriately determined by those skilled in the art. For example, in the above Example, when 2-aminobenzenethiol of the stabilizer for silver is added in an amount of 4 g/L or more, the crystal orientation becomes unstable, the surface loses gloss and turns yellow, and the solder wettability becomes poor; whereas when it is added in an amount of not more than 1 g/L, the stability of the plating liquor becomes poor and silver and copper precipitate in the form of metal.

The method of plating is not particularly restricted. In the present Example, jet plating using a sparger was conducted at a flow rate of the plating liquor of 400 L/min, a plating liquor temperature of 25° C. and a current density of 60 A/dm². The anode may be selected as desired from insoluble electrodes comprising preferably at least one member selected from the group consisting of platinum, iridium, tantalum, rhodium, ruthenium and the oxides thereof. In the present Example, an insoluble electrode formed by coating a mixture of iridium oxide and tantalum oxide on the ground of titanium was used as the anode to form an Sn—Ag layer having a silver content of 2.5% by weight and a thickness of 8 μm. Examination of crystal orientation using an X-ray diffraction apparatus has confirmed that it is an Sn—Ag layer containing Sn of the body-centered tetragonal structure.

Thus, an Sn—Ag layer 7 or an Sn—Cu layer 7 is formed on the surface of the outer lead part 2.

Succeedingly, a step for etching the oxidized layer 7a comprising tin, oxygen and a small amount of silver or copper formed by natural oxidation on the outermost surface of the Sn—Ag layer 7 is described below. In the present Specification, the term "oxidized layer" refers to a layer containing at least 30 atomic % of oxygen. First, as a pretreatment, the layer is subjected to a swelling treatment preferably with a treating liquid containing sodium hydroxide or a treating liquid containing sodium triphosphate. The concentration of the treating liquid and treating time may be appropriately selected. In the present Example, the oxidized layer 7a was swollen by immersion in a sodium triphosphate solution of a concentration of 120 g/L and a liquid temperature of 60° C. for 30 seconds.

Then the oxidized layer 7a is subjected to an etching treatment by reduction using succinic imide or a treating agent of non-succinic acid type such as 2-pyrrolidone-5-carboxylic acid and raising the oxidation-reduction potential of nickel, copper, iron or the like. In this way, the thickness of the oxidized layer 7a formed on the outermost surface of the Sn—Ag layer 7 can be made to be not more than 20 nm.

Further, a step of removing organic impurities on the outermost surface of the Sn—Ag layer 7 or a step of coating treatment may be provided. In the present Example, the layer was immersed in a 10% sulfuric acid of a liquid temperature of 40° C. for 15 seconds to remove organic impurities and oxides and thereafter subjected to an amine-type organic substance coating treatment for preventing the oxidation of the Sn—Ag layer 7 with 1–10 g/L of nitrogen-containing organic substances (trade name: Entex CU-56/Meltex).

The composition in the depth direction of the Sn—Ag layer 7 of the lead frame for semiconductor devices of the present Example formed as described above is explained with reference to FIG. 4.

Figure 4:
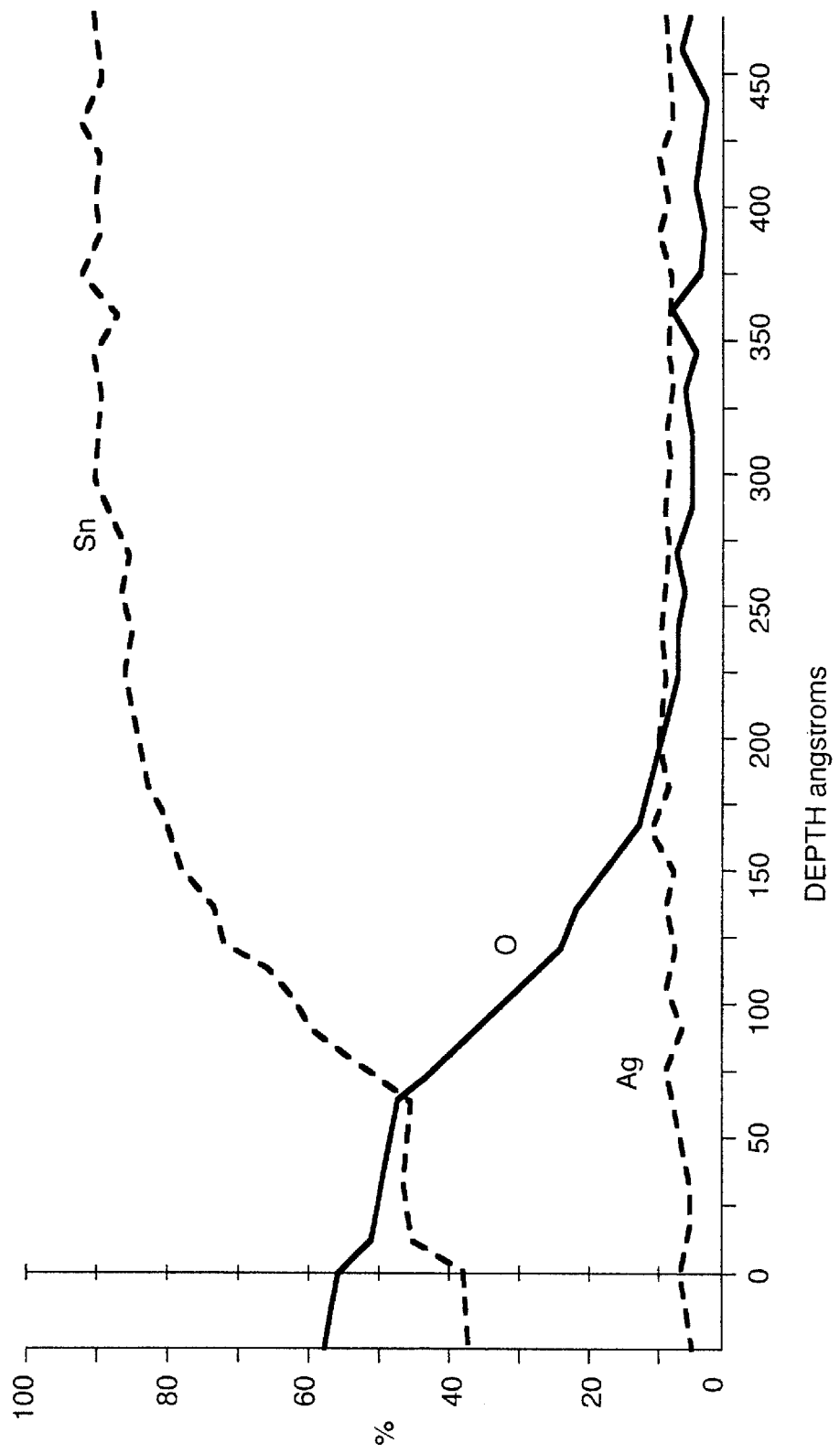
FIG. 4 is a graph showing a relation between the composition of the oxidized layer and the depth thereof in Embodiment 1 of the present invention.

FIG. 4 is a graph showing a relation between the composition of the oxidized layer and the depth thereof, wherein the composition of the oxide layer 7a formed on the outermost surface of the Sn—Ag layer 7 was analyzed by Auger electron spectroscopy and related with the depth of the layer.

In FIG. 4, the ordinate indicates the number of atoms of respective elements relative to the whole in terms of percentage and the abscissa indicates the depth of the oxidized layer 7a in Å.

It is revealed from FIG. 4 that the oxidized layer 7a has a nearly uniform composition until a depth of 50 Å; whereas at a depth of about 100 Å the oxygen content is only about 30 atomic %, showing that an oxidized layer 7a has not been formed. The ratio of oxygen to tin in the oxidized layer of the present invention was found to be 1:1 as calculated from the respective area ratios in FIG. 4.

The solder wettability of the Sn—Ag layer 7 of the lead frame for semiconductor devices of the present Example produced as described above was determined by the following method.

The outer lead part 2, alone, of the lead frame 1 for semiconductor devices having surface layer formed thereon was cut off and attached to a solder wettability testing apparatus, and determined for zero-cross time at the initial time and after heating at 175° C. for 24 hours by the solder wettability testing method according to the wetting balance method specified in JIS C 0053. The solder wettability testing apparatus used was SWET 100 (a trade name, mfd. by TARUTIN) and the determination was made at conditions of a solder bath temperature of 230° C., descending speed of 10 mm/sec, ascending speed of 4 mm/sec and dipping time of 0.2 sec. The solder used was a tin-lead (H 63S) solder and the flux used was R-100-40 (a non-halogen type).

The result of the determination is shown as Example 1 in table 1. Example 1 reveals that the lead frame 1 for semiconductor devices of the present Example shows zero-cross times at the initial time and after heating at 175° C. for 24 hours of both below 0.5 sec and thus has a sufficient solder wettability.

TABLE 1

|  | Example 1 | Comparative Example 1 |
| --- | --- | --- |
| Oxidized layer thickness | 100Å or less | about 300Å |
| Initial zero-cross time (sec) | 0.35 | 1.2 |
| Zero-cross time after heating (sec) | 0.45 | 5 |
| Discoloration | None | Yellowing |

COMPARATIVE EXAMPLE 1

Explanation is given below of the lead frame for semiconductor devices of Comparative Example 1.

In the present Comparative Example, alloy 194 is used as the lead frame substrate 5. The lead frame is formed by working up the alloy into the form of a lead frame through a pressing step and then, after a washing step, as occasion demands, subjecting the resulting frame to a heat-treating step to correct the deformation which has developed when the frame was punched out with a press in the pressing step.

Then, oily substances which have adhered to the lead frame substrate 5 in the pressing step and the heat-treating step are removed by a dipping method using an alkaline degreasing agents, etc. or by an electric method, used each alone or in combination, and then, according to the same method as in Example 1, a copper underlayer plating is formed in a thickness of not less than 0.2 μm and succeedingly an Ag layer is formed on the surface of the inner lead part by silver plating in a thickness of 8 μm.

After the Ag layer 6 has been formed, in order to improve the adhesion between the outer lead part 2 and an Sn—Ag layer 7 comprising silver and tin formed on the surface thereof, the surface of the outer lead part 2 is subjected to an etching treatment using a treating agent comprising at least one member selected from the group consisting of hydrochloric acid, nitric acid and sulfuric acid in the same manner as in Embodiment 1.

Succeedingly, an Sn—Ag layer 7 is formed on the outer lead part 2 by electroplating. The plating liquor was prepared such that the concentration of methanesulfonic acid used as the acid was 150 g/L, the SnO concentration was 40 g/L in terms of metallic tin and the $Ag_2O$ concentration was 1.5 g/L in terms of metallic silver.

The additives used were 5 g/L of aminophenyl disulfide as the stabilizer for silver, 5 g/L of naphthalensulfonic acid mono-polyethylene glycol ether as the stabilizer for tin and 80 g/L of bisphenol-A di-polyethylene glycol ether as the crystallization controlling agent. The anode used was an insoluble electrode formed by coating a mixture of iridium oxide and tantalum oxide on the titanium ground.

The plating was conducted by jet plating using a sparger at a plating liquor flow rate of 400 L/min, a plating liquor temperature of 25° C. and a current density of 20 $A/dm^2$. In the present Comparable Example, the Sn—Ag layer 7 was formed so as to have a silver content of 2.5% and a thickness of 8 μm.

Herein, the step of swelling the oxidized layer 7a formed on the surface of the Sn—Ag layer 7 and the step of etching the layer 7a were omitted, and the Sn—Ag layer 7 was finished, after immersed in a discoloration preventing agent, by washing and drying.

The composition in the depth direction of the Sn—Ag layer 7 of the lead frame for semiconductor devices of the present Comparative Example formed as described above is explained with reference to FIG. 5.

FIG. 5 is a graph showing a relation between the composition of an oxidized layer and the depth thereof, wherein the composition of the oxidized layer formed on the outermost surface of the Sn—Ag layer was analyzed by the Auger electron spectroscopy and related with the depth of the layer.

In FIG. 5, the ordinate indicates the number of atoms of respective elements relative to the whole in terms of percentage and the abscissa indicates the depth of the oxidized layer 7a in A.

It is revealed from FIG. 5 that the oxidized layer 7a has been formed until to reach about 400 Å.

The solder wettability of the surface treated layer provided to the outer lead part 2 of the lead frame 1 for semiconductor devices of the present Comparable Example constructed as described above was determined according to the same method as in

EXAMPLE 1

The result of the determination is shown as Comparative Example 1 in Table 1. Comparative Example 1 reveals that the lead frame 1 for semiconductor devices of the present Comparative Example shows an initial zero-cross time exceeding 1 second and moreover shows a marked deterioration after heated at 175° C. for 24 hours, the zero-cross time being 5 seconds, and thus does not have a sufficient solder wettability.

Since the solder wettability, as judged by the zero-cross time, is considered to be sufficient when it is not more than 1.0 second, Table 1 shows that the lead frame of Example 1 is satisfactory as a lead frame 1 for semiconductor devices and that of Comparative Example 1 is unsatisfactory. Further, the lead frame 1 for semiconductor devices of Comparative Example 1 shows a marked deterioration after heating and hence is unsatisfactory as a lead frame 1 for semiconductor devices that requires good heat resistance. Thus, it has been revealed that a lead frame 1 for semiconductor devices improved in solder wettability and heat resistance can be obtained as the result of forming an oxidized layer 7a in which the atomic ratio of oxygen to tin is 0.5–1.8 and of which the thickness is not more than 20 nm by forming an Sn—Ag layer 7 and thereafter treating the surface of the layer.

Though the Ag layer 6 was formed on the inner lead part 3 alone in the present Example, the Ag layer 6 may also be formed so as to cover a part of the pad 4 or to cover the whole of the pad 4.

Though the Sn—Ag layer 7 was formed by electroplating in the present Example, it may also be formed by such means as physical vapor deposition, sputtering and CVD.

As described above, according to the present Embodiment, by swelling the oxidized layer 7a formed on the outermost surface of the Sn—Ag layer 7 of the outer lead part 2 and subjecting the layer 7a to an etching treatment, thereby to form an oxidized layer in which the atomic ratio of oxygen to tin is 0.5–1.8 and of which the thickness is not more than 20 nm, the formation of stable $SnO_2$ having a high melting point in the oxidized layer of tin can be prevented and resultantly the deterioration of solder wettability can be prevented; furthermore, since the oxidized layer 7a assumes a layer structure of island structure or near thereto and the tin of the surface treated layer exposes itself to the surface, diffusion from molten solder and melting at the eutectic temperature are facilitated and resultantly the solder wettability is improved.

Embodiment 2

Figure 3:
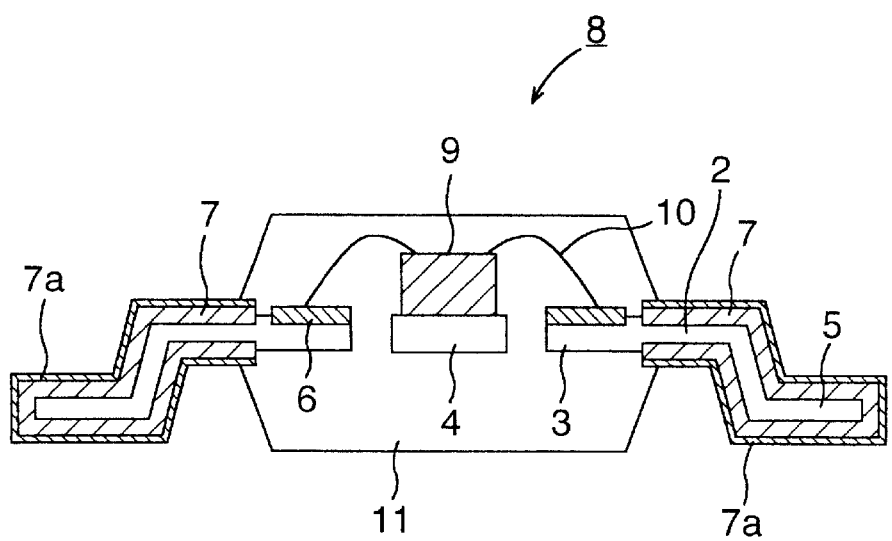
FIG. 3 is a schematic sectional view showing a semiconductor device in Embodiment 2 of the present invention.

FIG. 3 is a schematic sectional view showing the semiconductor device in Embodiment 2 of the present invention.

In FIG. 3, numeral 2 indicates an outer lead part, 3 an inner lead part, 4 a pad, 5 a lead frame substrate, 6 an Ag layer and 7 an Sn—Ag layer; they are respectively the same as in example 1 and indicated by the same reference numerals, and further explanations are omitted. Numeral 8 indicates a semiconductor device in the present Embodiment, 9 an IC (integral circuit) chip, 10 a bonding wire formed of a metal wire having a high electroconductivity and 11 a mold resin for sealing the IC chip 9.

The lead frame for semiconductor devices used is similar to that in Embodiment 1.

The process for producing the semiconductor device of the present Embodiment constructed as described above is described in detail below.

First, die bonding resin is coated on the pad 4 of a lead frame 1 for semiconductor devices which is similar to that in Example 1, the IC chip 9 is placed on the pad 4 and bonded thereto, and the resulting assembly is, as it is, dried to fix the bonding in an oven. Then the predetermined places of the inner lead part 3 and the IC chip 9 are electrically connected with the bonding wire 10, then the IC chip 9 is sealed with the mold resin 11, and the resin is shaped with a die and solidified. Thus a semiconductor device 8 is formed.

In previous processes, a surface layer for improving solder wettability was formed, after the IC chip 9 had been sealed with the mold resin 11, by removing the oxidized layer 7a of the surface of the outer lead part 2 and then plating solder thereon. According to the process of the present invention, the above-mentioned steps are unnecessary and hence the production step of a semiconductor device 8 is simplified.

Furthermore, by making the content of silver in the Sn—Ag layer 7 to 1–8% by weight, the development of tin whiskers on the surface of the outer lead part 2 can be prevented, and the occurrence of short circuit accidents due to the development of tin whiskers in the semiconductor device 8 can be prevented.

Though in the present Example the semiconductor device 8 was formed by using a lead frame 1 for semiconductor devices wherein the Sn—Ag layer 7 had been formed on the surface of the outer lead part 2 and the surface of the layer 7 had been treated, the formation of the Sn—Ag layer 7 and the treatment of its surface may also be conducted after the IC chip 9 has been sealed with the mold resin 1. That is, the intended semiconductor device may also be obtained by first producing a semiconductor device 8 by using a lead frame substrate which has been prepared by working up a metal sheet into the form of lead frame through a pressing step and then forming an Ag layer 6 on the surface of the inner lead part 3 by silver plating, and thereafter forming the Sn—Ag layer 7 and treating the surface of the layer 7.

What is claimed is:

1. A lead frame for semiconductor devices comprising
   i. a substrate comprising nickel, copper, iron or an alloy comprising at least one member selected from the group consisting of nickel, copper and iron,
   ii. an inner lead part having a surface layer A, the surface layer A comprising silver or an alloy comprising silver, and
   iii. an outer lead part having a surface layer B, the surface layer B comprising silver and tin, or copper and tin, wherein the surface layer B has on its surface an oxidized layer comprising tin and oxygen, the atomic ratio of oxygen to tin in the oxidized layer is 0.5–1.8 and the thickness of the oxidized layer is not more than 20 nm.

2. The lead frame according to claim 1 wherein the tin has the body-centered tetragonal structure.

3. The lead frame according to claim 1 wherein the silver content of the surface layer B is 1–8% by weight or the copper content thereof is 0.1–2% by weight.

4. The lead frame according to claim 1 wherein the thickness of the surface layer B is 3–15 $\mu$m.

5. The lead frame according to claim 1 wherein the surface layer B has been formed by electroplating using as the anode an insoluble electrode comprising at least one member selected from the group consisting of platinum, iridium, tantalum, rhodium, ruthenium and the oxides thereof.

6. The lead frame according to claim 1 wherein the oxidized layer has been treated by swelling a layer with a treating agent containing sodium hydroxide or sodium triphosphate and then subjecting the swollen part to an etching treatment by an electrochemical method.

7. A semiconductor device formed by using the lead frame for semiconductor devices according to claim 1.

8. A process for producing a lead frame for semiconductor devices comprising a step of swelling the outer lead part having a surface layer B with a treating agent containing sodium hydroxide or sodium triphosphate and a step of subjecting the swollen part to an etching treatment by an electrochemical method, for the purpose of forming an oxidized layer comprising tin and oxygen in which the atomic ratio of oxygen to tin is 0.5–1.8 and of which the thickness is not more than 20 nm on the surface of a surface layer B provided to the surface of the outer lead part.

* * * * *